United States Patent
Keefe

(10) Patent No.: US 6,819,115 B1
(45) Date of Patent: Nov. 16, 2004

(54) FAULT LOCATION DEVICE AND METHOD

(75) Inventor: Raymond Anthony Keefe, Endeavour Hills (AU)

(73) Assignee: Aegis Pty., Ltd., Victoria (AU)

( * ) Notice: Subject to any disclaimer, the term of this patent is extended or adjusted under 35 U.S.C. 154(b) by 0 days.

(21) Appl. No.: 10/049,277

(22) PCT Filed: Aug. 11, 2000

(86) PCT No.: PCT/AU00/00964

§ 371 (c)(1),
(2), (4) Date: May 16, 2002

(87) PCT Pub. No.: WO01/13132

PCT Pub. Date: Feb. 22, 2001

(30) Foreign Application Priority Data

Aug. 11, 1999 (AU) .............................................. PQ2157
Sep. 27, 1999 (AU) .............................................. PQ3088

(51) Int. Cl.[7] .............................................. G01R 31/08
(52) U.S. Cl. ..................................... 324/527; 324/539
(58) Field of Search ................................ 324/509, 520, 324/522, 523, 528, 529, 533, 534, 539; 340/652; 361/42

(56) References Cited

U.S. PATENT DOCUMENTS

| | | | |
|---|---|---|---|
| 3,991,363 A | * | 11/1976 | Lathrop ....................... 324/529 |
| 4,691,165 A | | 9/1987 | Szedlmajer |
| 4,896,117 A | | 1/1990 | Floweredew et al. |
| 5,001,430 A | | 3/1991 | Peterman et al. |
| 5,210,497 A | | 5/1993 | Regini |
| 5,714,885 A | * | 2/1998 | Lulham ....................... 324/529 |

FOREIGN PATENT DOCUMENTS

| | | |
|---|---|---|
| AU | 49062/90 A | 9/1990 |
| WO | WO 91/20001 A1 | 12/1991 |
| WO | WO 91/20002 A1 | 12/1991 |
| WO | WO 95/30913 A1 | 11/1995 |

* cited by examiner

Primary Examiner—Anjan Deb
Assistant Examiner—Walter Benson
(74) Attorney, Agent, or Firm—Sughrue Mion, PLLC

(57) ABSTRACT

A device (32) determines the location of a fault in an underground cable causing an earth leakage path from an internal conductor to earth at the location of the fault, such that when a signal is applied to the conductor, an earth leakage signal flows between the earth and conductor at the location of the fault. A multi-frequency signal is applied to the cable, this having at least two frequency components. Probes (24a, 24b) are positionable to receive the earth leakage signal. A processor (50) rectifies a first component of the earth leakage signal, corresponding to one frequency component of the applied signal, multiplies the rectified first component of the earth leakage signal with a second component of the earth linkage signal, corresponding to another frequency component of the applied signal, and from the result of that multiplication indicates the direction from the device to the fault.

10 Claims, 9 Drawing Sheets

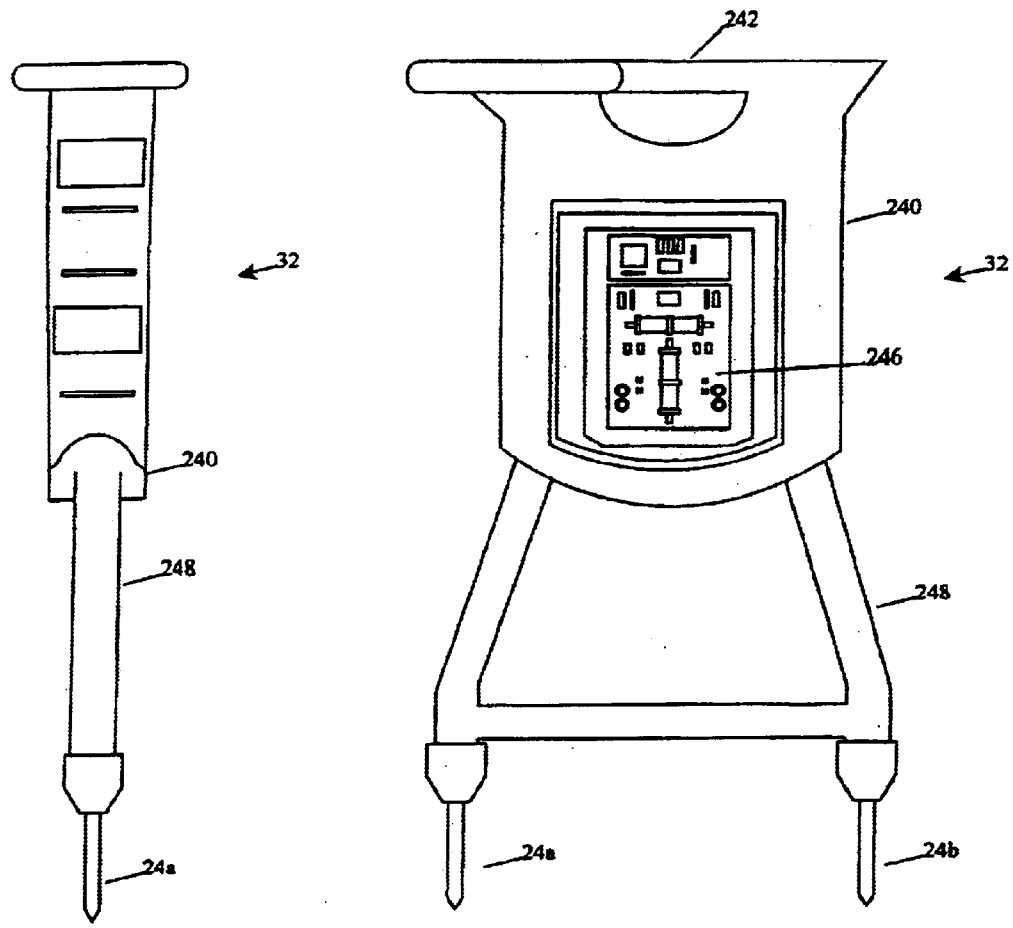
FIGURE 15  FIGURE 14
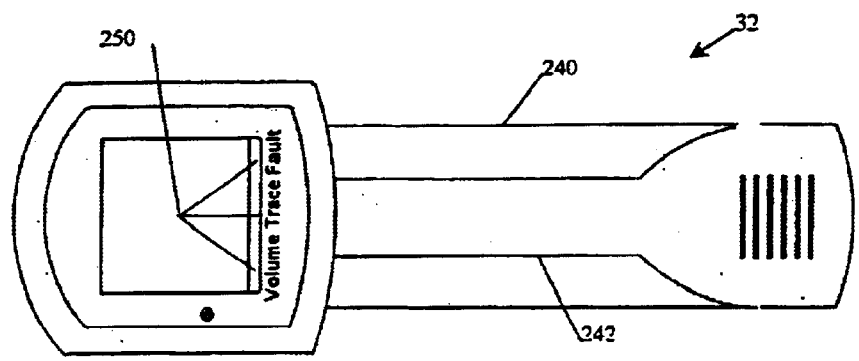
FIGURE 16

FAULT LOCATION DEVICE AND METHOD

This is a National stage entry under 35 U.S.C. § 371 of Application No. PCT/AU00/00964 filed Aug. 11, 2000; the disclosure of which is incorporated herein by reference.

BACKGROUND OF THE INVENTION

This invention relates to a fault location device and method, useful for determining the position of a fault in a cable.

Buried underground cables and pipes (often referred to as "services") sometimes develop faults and are not always clearly marked on plans, especially if they were not recently installed.

Precise fault location is desirable in the interests of reducing the amount of digging required to repair the cable. Underground cables can develop a number of different faults. Some examples are:

open circuit;
short circuit to another conductor;
short circuit to the shield; and
short circuit to the ground, also known as a sheath fault because the cable sheath has been breached.

A fault of primary interest is the sheath fault. One common method of detecting the location of this is to use a ground probe to search for maximum signal strength. This is effective because the ground is a volume conductor and the fault current is denser near the fault than it is as one moves further away. The maximum current point will be nearest the fault. One drawback of this method is that it is not possible to tell the direction to the fault and one must hunt to find whether one is moving closer to the fault or further from it. It is possible to address this limitation by various methods.

One method employs a large DC voltage to produce a deflection on a DC voltmeter. The direction of the deflection shows the direction to the fault, as the current flow is always away from the fault. The disadvantages of this method are that there are often DC current offsets in the soil which can give false readings and most cable connected equipment may not be tolerant of high DC voltage levels.

Another method is to use a very large voltage pulse to produce a deflection on a meter. The direction of the deflection shows the direction to the fault. The disadvantages if this method are that it is unreliable in wet soil, and the voltage pulse can damage the cable insulation or connected devices. The advantage over the DC voltage method is that it reduces problems due to local DC or very low frequency AC currents in the soil.

A further method involves adding a higher frequency carrier signal which is picked up by an antenna. This is processed and compared to the signal in the ground to determine the polarity of the signal in the ground. This method has the advantage that the ground signal can be a continuous AC signal. The drawback is that one must keep the receiving device locked to the cable frequency, and higher frequencies have a lower range.

Another method uses multiple harmonically related frequencies simultaneously to try and calculate the direction to the fault. The phase relationships of the signals are compared and the sign of the deviation between them is used to determine the direction to the fault. The sign of the phase deviation is equal to the polarity of the signal and hence the direction can be calculated. The advantages of this method are that it lessens the problems with DC signals, and also overcomes the need to keep the receiver locked to an external signal on the cable. The disadvantage is that errors in signal phase caused by noise and mains switching transients can produce incorrect results, effectively pointing the user of the device in the wrong direction.

A method of sheath fault location using a transmitter and a ground probe based receiver illustrated in FIG. 1.

A signal is placed on the cable 14 at a convenient access point by use of a generator 20. The return path for the signal is ground. The actual conductor used is the one with the sheath fault on it, otherwise there would be no return current. The fault is represented by an impedance 22 to ground and located at location 23 along the cable. In practice, the ground return path is complex and depends on the type of soil, moisture content, depth of cable and the presence of other buried conductors such as metal water pipes.

A ground probe 24, represented as a volt meter, is used to measure the voltage potential in the ground to determine the direction from the ground probe to the fault. This has two ground probe elements 24a, 24b which are positioned in spaced relationship in the ground, the probe if necessary being moved to various successive ground locations at which the probes are entered into the ground, and meter readings taken at the voltmeter.

Near to the fault, the ground currents branch out from the fault. Because of this, the ground probe can correctly identify the direction to the fault from either side of the fault. Directly over the fault, there is no signal at all and it is by determining the location of the probe at which this result ensues that the location 23 of the fault is determined. This is illustrated in FIG. 2 where the currents branching out from cable 14 at the fault are illustrated diagrammatically by arrows 26, and the polarities of detected signal at the voltmeter when positioned along the length of the cable, but to opposite sides of the fault is shown as being relatively reversed. There is no detected signal when the voltmeter is positioned adjacent the fault, and this is how the fault is located.

To reduce losses due to cable capacitance, lower frequencies are preferred. But frequencies in the normal operating range of the cable may cause cross talk and interference to other cables. As a result, frequencies below 300 Hz or above 3.4 KHz may be preferred. Frequencies below 300 Hz are however close to the harmonics and fundamentals of power frequency transmission equipment. As a result, signals well below 50/60 Hz may be most preferable.

There are three basic methods that might be used to show the direction to fault:

DC shift;
cable carrier and/or locked carrier reference; and
phase deviation.

The DC shift method involves either placing a large DC voltage on the cable or using a large pseudo impulse. The latter is preferable because it is less susceptible to local DC and low frequency AC currents, but both methods suffer from limited range in the wet and the possibility of damaging the cable.

The method cable carrier and/or locked carrier reference involves locking an on-board reference to the transmitter. This can be most easily achieved by sending a carrier signal down the same cable and picking it up with an antenna. Alternatively, a radio based carrier system could be used. Another method is to lock the receiver to the transmitter and hold the lock using a very low drift oscillator. In practice, a low drift oscillator locked to a cable borne signal may be more easily achieved. The disadvantage is that cable borne signal must be a high enough frequency to be readily picked up by a compact antenna and this normally brings it into or above the voice band. Signals in the voice band are not preferred by telecommunications carriers and higher frequencies are harder to keep phase aligned due to capacitive effects in the cable.

The phase deviation method involves using more than one frequency and measuring the direction of phase deviation between the two signals. If the direction of deviation is one polarity, then the fault lies in one direction, otherwise it lies in the other. These methods suffer from the fact that phase distortion or noise can cause erroneous results, even reversing the direction. Lower frequencies are preferred to improve range and reduce phase distortion due to capacitive effects, but because of the close proximity to mains power frequencies and their harmonics, substantial filtering is required. Filters are difficult to make phase shift free, and high Q band pass filters can ring in the presence of noise and switching transients, giving rise to false detections and incorrect direction results. At the very least, careful phase alignment is required.

In all of the above cases, it is difficult to provide high confidence that the user will correctly interpret the results and know when to ignore spurious readings.

The DC shift method involving high voltage pseudo impulses requires the operator to ignore slowly drifting meter movements, and to recognise a characteristic flicker due to the voltage spike. Audible feedback from the transmitter also helps for nearby faults. Unfortunately once the signal level drops, it is difficult for the operator to distinguish the random noise from the signal which is then likely to be minuscule.

The cable carrier systems and phase deviation systems have a similar difficulty. Once the signal level falls, the meter indicator can move sporadically in either direction, and it is hard for the user to objectively interpret the result.

Some systems attempt to also give the user an idea of the signal level, but this can also be misleading. A weak signal in a quiet area may be much more usable than a strong signal in a very noisy area such as near a mains power substation or railway line with track circuits energised to detect passing trains. Systems which ignore signals once the level falls sacrifice range.

SUMMARY OF THE INVENTION

The invention provides a device for determining location of a fault in an underground cable causing an earth leakage path from an internal conductor to earth at the location of the fault whereby, when signal is applied to the conductor, earth leakage signal flows between the earth and conductor at the location of the fault, wherein the applied signal is a multi-frequency signal having at least two frequency components, the device having probe means positionable to receive the earth leakage signal, and means for rectifying a first component of the earth leakage signal corresponding to one said frequency component of said applied signal, multiplying the rectified first component of the earth leakage signal with a second earth leakage signal corresponding to another frequency component of the applied signal and, from the result of said multiplication, determining the direction from the device to the fault.

Preferably, the device incorporates means for detecting and removing artifacts due to external interference such as switching transients.

Preferably, the device incorporates means for determining a confidence indication, indicating a degree of reliability of said result. The last-mentioned means may operate to determine said confidence indication by applying selected criteria to said result, such as the ratio between maximum positive and negative excursions thereof, and/or the signal-to-noise ratio of the detected signal and/or the absolute signal strength of the detected signal, and/or said signal components.

The invention also provides a method for determining location of a fault in an underground cable, wherein signal is applied to the cable to cause generation of an earth leakage signal from an internal conductor of the cable to earth, at the location of the fault, the applied signal being a multi-frequency signal having at least two frequency components, receiving the earth leakage signal, and rectifying a first component of the earth leakage signal corresponding to one frequency component of said applied signal, multiplying the rectified first component of the earth leakage signal with a second frequency component of the earth leakage signal corresponding to another said frequency component of the applied signal and, from the result of said multiplication, determining the direction from the device to the fault.

Some or all of signal processing may be effected digitally, under control of suitable software. The invention also provides a method for determining location of a fault in an underground cable, wherein signal is applied to the cable to cause generation of an earth leakage signal from an internal conductor of the cable to earth, at the location of the fault, the applied signal being a multi-frequency signal having at least two frequency components, receiving the earth leakage signal, and rectifying a first component of the earth leakage signal corresponding to one frequency component of said applied signal and multiplying the rectified first component of the earth leakage signal with a second frequency component of the earth leakage signal corresponding to another said frequency component of the applied signal, such that the result of said multiplying then represents the direction from the device to the fault. The multiplication may be effected as an array multiplication of sets of time-spaced samples of the first and second components of the earth leakage signal.

BRIEF DESCRIPTION OF THE DRAWINGS

The invention is further described, by way of example only, with reference to the accompanying drawings, in which:

FIG. 14 is a front view of a fault location device of the invention;

FIG. 15 is a side view of the fault location device of FIG. 14; and

FIG. 16 is a plan view of the fault location device of FIG. 14.

DETAILED DESCRIPTION OF THE INVENTION

The exemplary embodiment of the invention to be described uses a transmitter which in use is connected to a cable and applies to it a multi-frequency signal. In this exemplary embodiment, two frequency components are applied, having frequencies of 8 Hz and 16 Hz respectively.

Figure 1:
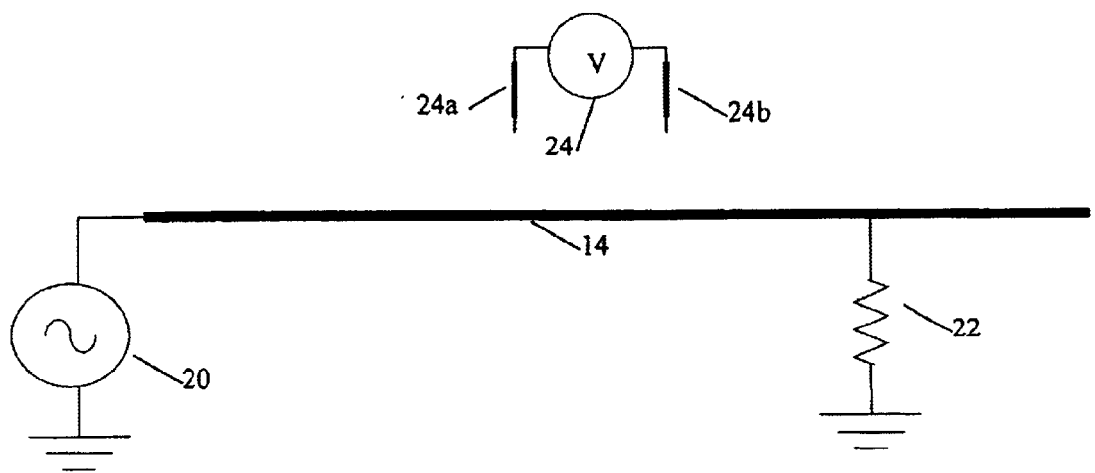
FIGS. 1 and 2 illustrate general principles of fault location in a cable.
Figure 2:
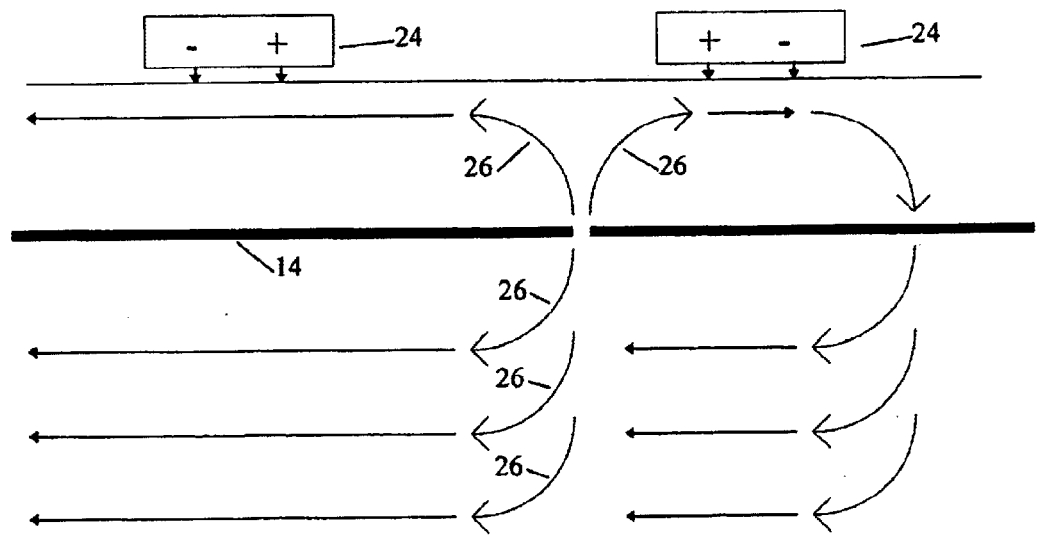
Figure 3:
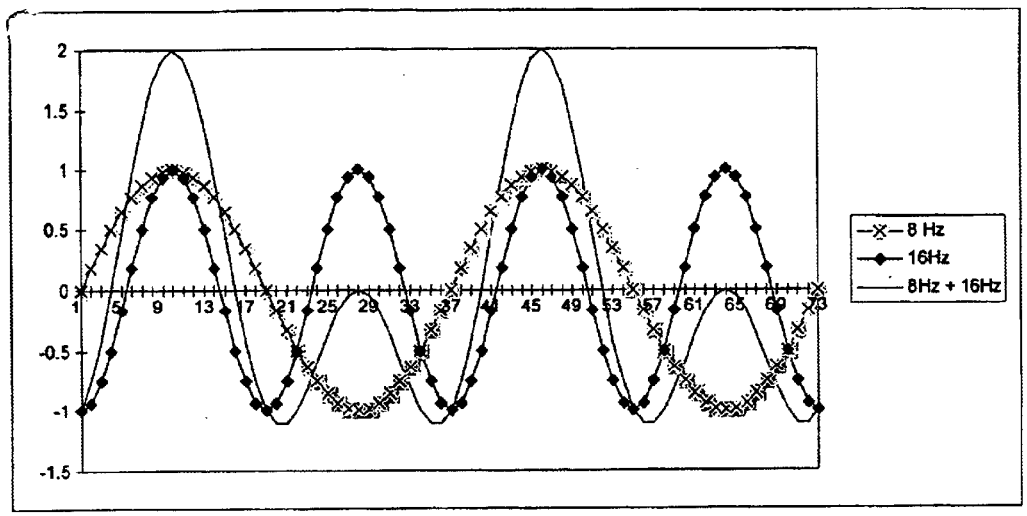
FIG. 3 is a waveform diagram showing waveforms applied to a cable for fault location detection in accordance with a fault location device constructed in accordance with the invention.

FIG. 3 shows the waveform produced at the transmitter and its 8 Hz and 16 Hz components. Here, the amplitude of the final composite 8 Hz+16 Hz waveform is kept to below 150V Peak to Ground which will not harm normal telephony cable insulation nor most connected devices. The waveform is a simple mix of two frequencies. A factor of 2 is used for the two frequencies. Other factors could be used but a more complex function than taking the absolute value of the lower frequency would be required and the repetition interval would increase which would slow down the measurement rate. Also, if higher factors are used then it is much harder to filter out the noise and interference signals, especially if you are operating below the normal mains power frequencies. If ratios below 2 are used, eg. 3:2, then the filtering problems are avoided but more complex functions and longer repetition intervals are again required. Choice may best be based on a balance between filtering, ambient signals and the time it takes to collect the sample. At 8 Hz it takes 125 msecs for a full wavelength, at 4 Hz it takes 250 msecs and at 0.1 Hz excessively long processing times may result.

The form of the transmitter waveform is preferably relatively simple, and largely non-critical, as described. This is advantageous, because the signal is transmitted through ground which is a noisy and unpredictable medium. Special features may become distorted and a complex spectral or phase based pattern may be rendered unrecognisable, especially as the distance from the fault to the ground probe increases.

Figure 4:
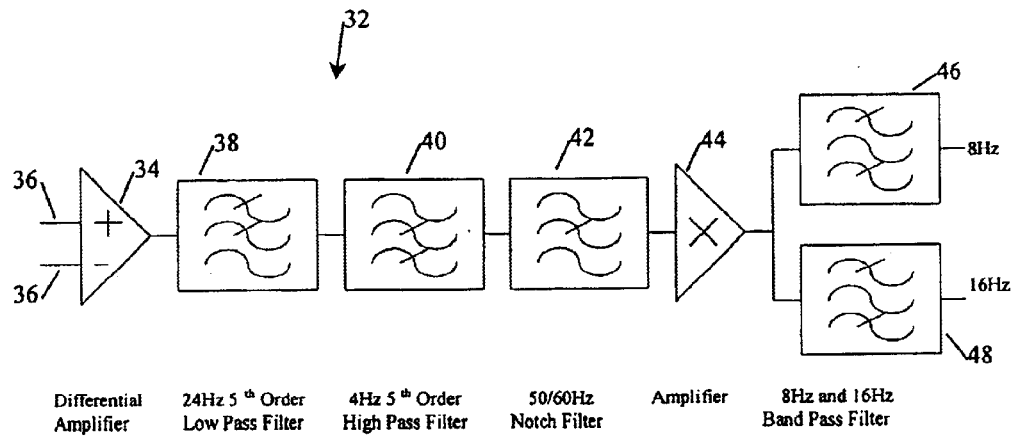
FIG. 4 is a diagram of a fault location device constructed in accordance with the invention.

FIG. 4 shows a ground probe 32 useful in practising the invention. This has a differential amplifier 34, used to amplify the voltage difference between ground probe elements 36. Fifth order low pass and high pass filters 38, 40 are used to remove out of band noise. These are set at 24 Hz and 4 Hz respectively. A notch filter 42 is also used to remove mains power primary frequencies, at for example either 50 Hz or 60 Hz. The resulting signal is amplified at amplifier 44 and fed through two band pass filters 46, 48 to isolate the 8 Hz and 16 Hz signal components. A delay equaliser (not shown) is used to compensate for phase shift between the signals as a result of the processing.

Once the 8 Hz and 16 Hz signals are acquired, they are processed by a processor 50.

In order to obtain polarity information from the so extracted waveforms without using phase deviation and its inherent problems with noise immunity, the 8 Hz signal is first rectified. Next it is array multiplied with the 16 Hz signal.

The multiplication is element-by-element in the following manner:

$$[a_1,a_2,a_3,a_4 \ldots ]*[b_1,b_2,b_3,b_4 \ldots ]=[a_1*b_1, a_2*b_2, a_3*b_3, a_4*b_4 \ldots ]$$

where $a_n$ and $b_n$ are respective time spaced samples of the rectified 8 Hz signal and the 16 Hz signal.

Figure 5:
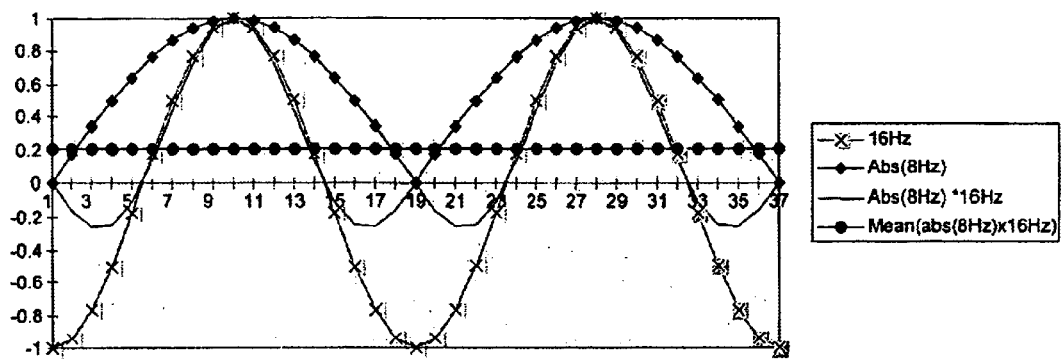
FIG. 5 is a waveform diagram illustrating signal manipulations effected in accordance with the invention.

The resulting signal shows a reproducible characteristic with the mean offset being in the direction of the 16 Hz signal peak which is closest to the 8 Hz signal peak. This characteristic may be stable with nearly 90 degrees of phase shift in the 16 Hz signal. This is a substantial improvement over the phase deviation methods. FIG. 5 illustrates these manipulations.

It is noted that there is an obvious ratio between the maximum negative excursion and the maximum positive excursion. This is at around 1:4. There is also a natural ratio between the mean and the maximum positive excursion. This is around 1:6. By applying these metrics to the acquired signal it is possible to deduce the likelihood that the signal has only good components.

Also, if a switching transient does occur, there will be expected to be a substantial discrepancy in the metrics. If all signals that exceed the peak to mean ratio are clipped, and the metric re-run, then the influence of the positive peak will be expected to be reduced and no longer cause an excessive contribution to the mean calculation.

Figure 6:
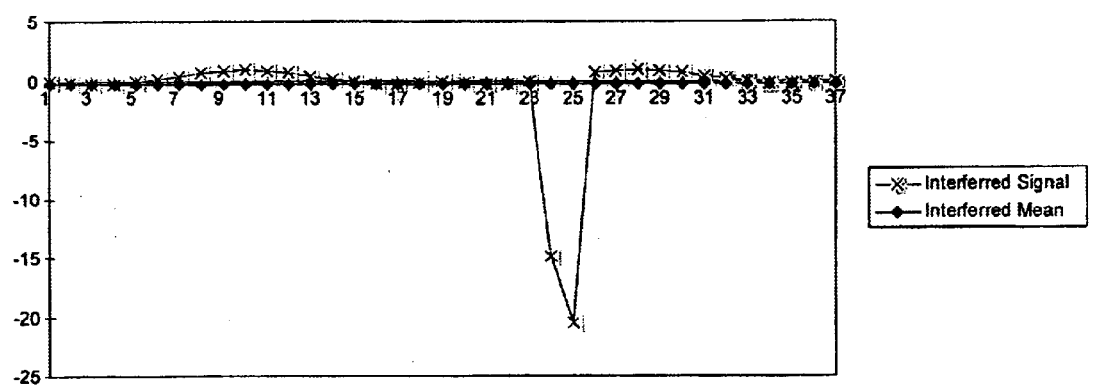
FIGS. 6, 7 and 8 are diagrams illustrating operation of the fault locating device in accordance with the invention.

FIG. 6 shows the above-mentioned rectified and array multiplied signal in the case where this includes a large interfering peak.

Figure 7:
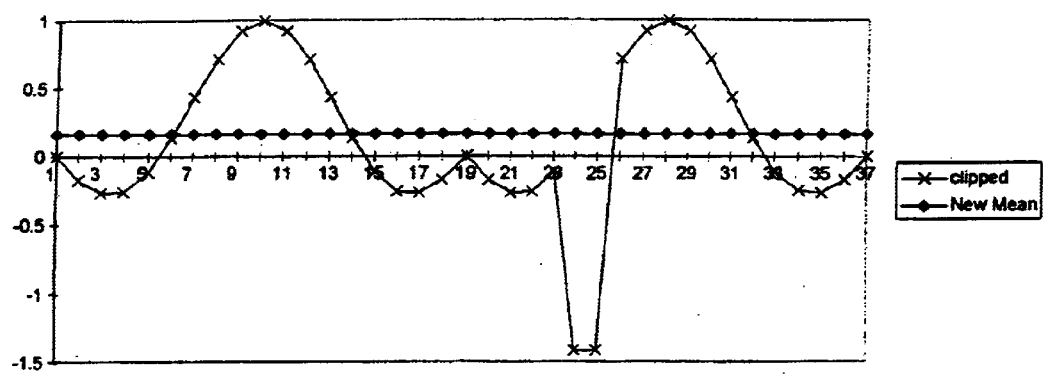

The mean in this case is very slightly negative, although the mean for just the signal components that are part of the transmitted waveform would be expected to be positive. FIG. 7 shows the signal after the metric has been run and the peak excursions clipped. As can be seen, the mean is now positive, and the effect of the interference has been overcome.

It is also possible to use the metric to eliminate results that are so heavily distorted that they cannot be successfully corrected. This lessens the problem of giving the operator a misleading result which the operator must otherwise recognise and ignore. The unit may do that for the operator, and at least substantially avoid providing spurious data.

Because the mean of the array multiplied signal is known, both before and after the clipping, the ratio of these means can be used to gain confidence in the direction indication. If the ratio is close to one, then the original signal conformed fairly well to the target metric and is likely to be good. If the ratio is high, then confidence is reduced as the original signal did not fit the profile very well.

In addition, the ratio of the peak to the mean is also well defined. If this is within allowed limits before and after the clipping then confidence is high. If the ratio was outside the limits before clipping but came back into line after clipping, then confidence is less. If the ratio is poor for both cases then confidence is low.

For example, start with confidence=100%.

1. If the peak to mean ratio before clipping was more than 20, and the target was 6, then reduce confidence by 50%, otherwise if the ratio was 10 then reduce confidence by 25%.

2. Now clip the signal. If the new peak on mean ratio is more than 20, then half the confidence, otherwise if it is more than 10, then reduce confidence to ¾ of the previous amount.

3. Now divide the peak on mean ratio before clipping by the peak on mean ratio after clipping. If this ratio is more than 3 then reduce confidence by ½, else if it is greater than 2, then reduce confidence to ¾ of the previous value.

At the end of this, a final confidence interval is reached. For a good clean signal, confidence will be 100%. This is as expected. If the signal was clean enough after clipping but a bit dirty beforehand, confidence will be 75%, and so on. This process can be extended to any number of steps depending on the complexity of the metric. The exemplary thresholds given here have been found satisfactory for the waveform and metric used as an example of the method. Once the confidence falls to a low enough level, ie<33%, then declaring results may be stopped as the results are almost certainly unreliable.

Although a specific implementation is described here in order to properly explain the invention, other enhancements are also possible.

Figure 8:
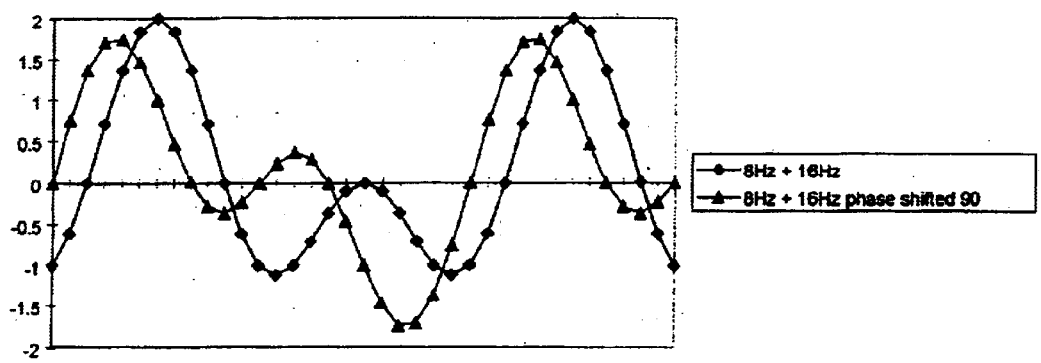

The transmitted power can be increased without increasing the peak voltage excursion of the waveform by altering the phase relationships between the waveforms. FIG. 8 illustrates this. As can be seen, the peak excursion of the second waveform is symmetrical at about+/−1.8, whereas the initial waveform has a peak positive excursion of 2. Both have a DC average of zero. The receiver must realign the phases again to ensure the metrics still work but this is simple to do.

The example implementation here employs a mixture of analog and digital processing. The selection of which part of the process is done in which way is a matter of design choice. Metrics may be done using analog circuitry, and the filtering could also be done digitally with A/D sampling earlier in the chain. The choice of signal processing method is not critical to the implementation of the improved method for finding the sheath fault location.

Although this implementation only uses two frequencies, it is possible to extend the methods used to multiple frequencies and similar metrics across these frequencies in groups of two or more at a time.

In additional to measuring basic waveform metrics such as peak to mean ratio, other more complex metrics can be applied, such as least squares fit to a target waveform. The specific choice of metrics is a compromise between ease of computation and likelihood that error detection will be improved by adding the metric. The examples given here have been demonstrated to work satisfactory for a ground based sheath fault locator.

Averaging a number of results can further reduce spurious readings. The results can either be averaged when initially collected or else averaged after processing. There are some advantages of post processing averaging as only the better results get included in the average. Use of spurious results should obviously be avoided. The confidence factor can also be used to create a weighted average where the higher confidence results have more bearing on the final result than the lower confidence results.

Figure 9:
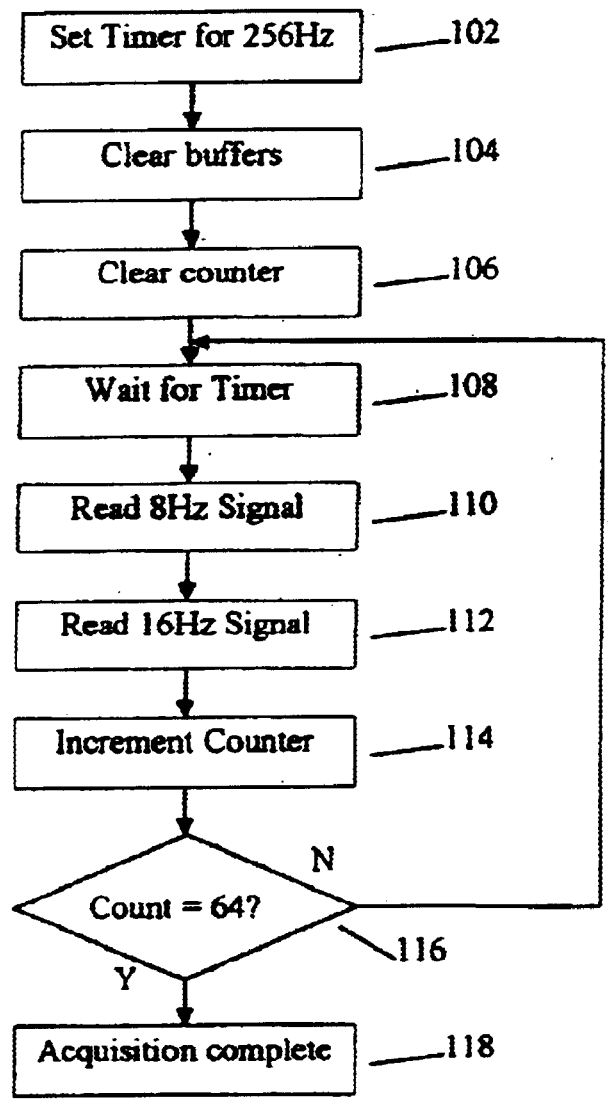
FIGS. 9 to 12 are flow charts describing software manipulation effected in operation of a fault locating device constructed in accordance with the invention.
Figure 10:
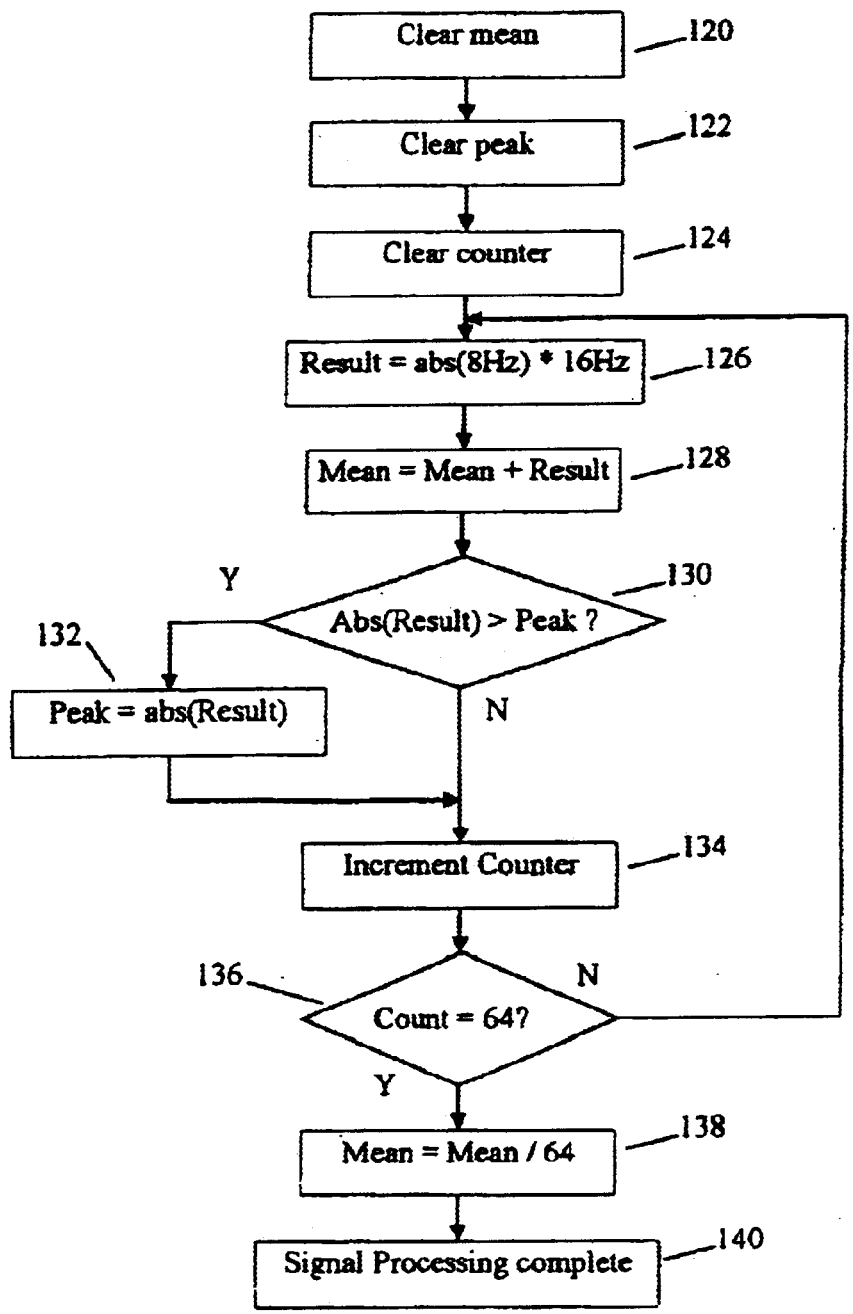
Figure 11:
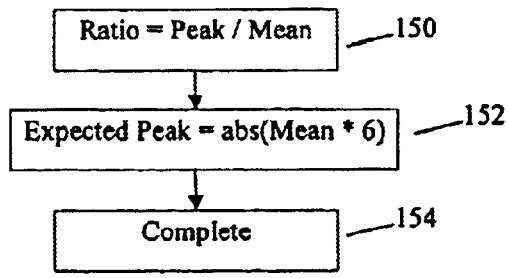

FIGS. 9 to 11 are flow charts illustrating software executed steps in an exemplary device constructed in accordance with the invention.

FIG. 9 shows steps in acquiring data samples of received signal. In samples are acquired at a 256 Hz sample rate, 64 samples being acquired for each overall program execution. This provides 250 mseconds of data or two complete cycles of the 8 Hz waveform.

Execution of the data acquisition steps as illustrated in FIG. 9 begins by setting a timer for 256 Hz, at step 102, followed by clearing of buffers and a counter at steps 104, 106. Thereafter at step 108, the program awaits the timer, and then reads the 8 Hz and then the 16 Hz signal at steps 110, 112. At the next step, step 114, a counter is incremented by one step and at the following step 116 a determination is made as to whether the count incremented at step 114 has reached 64. If it has not reached 64, steps 108 through to 116 are repeated, this being so repeated until the count reaches 64 after which, at step 118 acquisition is complete.

In the steps illustrated at FIG. 10, the 64 data points for each of the 8 and 16 Hz signals as acquired by the process steps shown in FIG. 9 are processed. First, at steps 120, 122, 124, mean, peak and counter registers are cleared. Then, for the first data point acquired, the multiplication of the absolute value of the 8 Hz signal together with the 16 Hz signal is computed, at step 126, to which a mean figure, comprising a previous mean, plus the result of step 126 is computed, this being executed at step 128. After this, at step 130, comparison of the absolute value of the result of step 126 is made with that of a peak value (initially zero) and if that absolute value is greater than the peak, the peak is, at step 132, updated to reflect the absolute value of the result of step 126. Next, a counter initially set to zero is incremented one step, this being effected at step 134. Then, at step 136, it is determined whether the counter has reached a stored count of 64. If it has not, steps 126 through 136 are repeated, this repeating being effected until the count reaches 64 after which at step 138 there is computed a mean value representing the mean accumulated by the repeated executions of step 128 divided by 64. After that, at step 140, signal processing is judged complete.

FIG. 11 shows program steps for determining a metrics calculation. First, at step 150, the ratio of the peak value to the mean value as computed at steps 132 and 138 is computed. Then, at step 152, an expected peak value is set as the absolute value of the mean computed at step 138 multiplied by six. The program execution of this part of the program is completed after this, at step 154.

Figure 12:
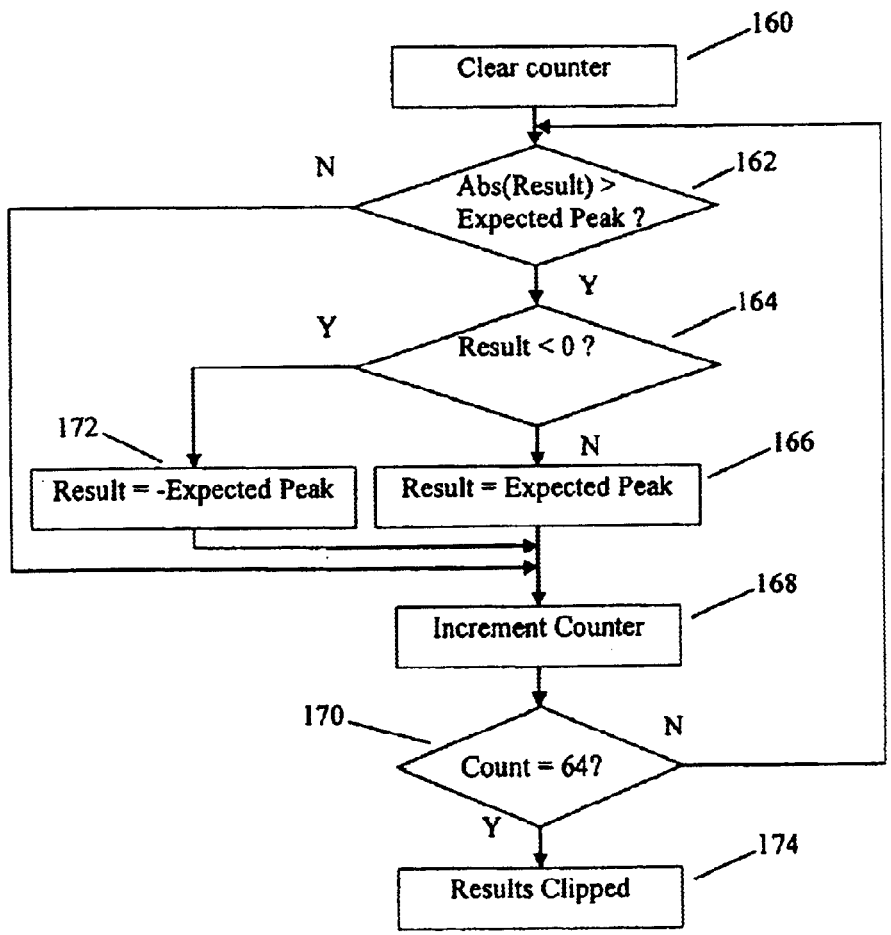

FIG. 12 illustrates steps in effecting clipping of results according to expected peak result. At step 160, a counter is cleared. Then, at step 162, a comparison is made between the absolute value of the result, as computed at step 126, and an expected peak value. If the absolute value of the result is greater, than the expected peak, it is then determined whether the result value is less than zero. If not, the result is set to the expected peak, at step 166; otherwise it is set to the negative of the expected peak at step 172 (described later). If, at step 162, the absolute value of the result is not greater than the expected peak, steps 164 and 166 and 172 are skipped and the program moves to step 168. Program execution precedes from step 166 or step 172 also to step 168, which is to increment the counter. At step 170, it is determined whether the count in the counter has reached 64. If not, program steps 162 and 164 and, if appropriate, one or more of steps 166 or 172, are repeated as before described. Otherwise, results clipping is completed at step 174.

Figure 13:
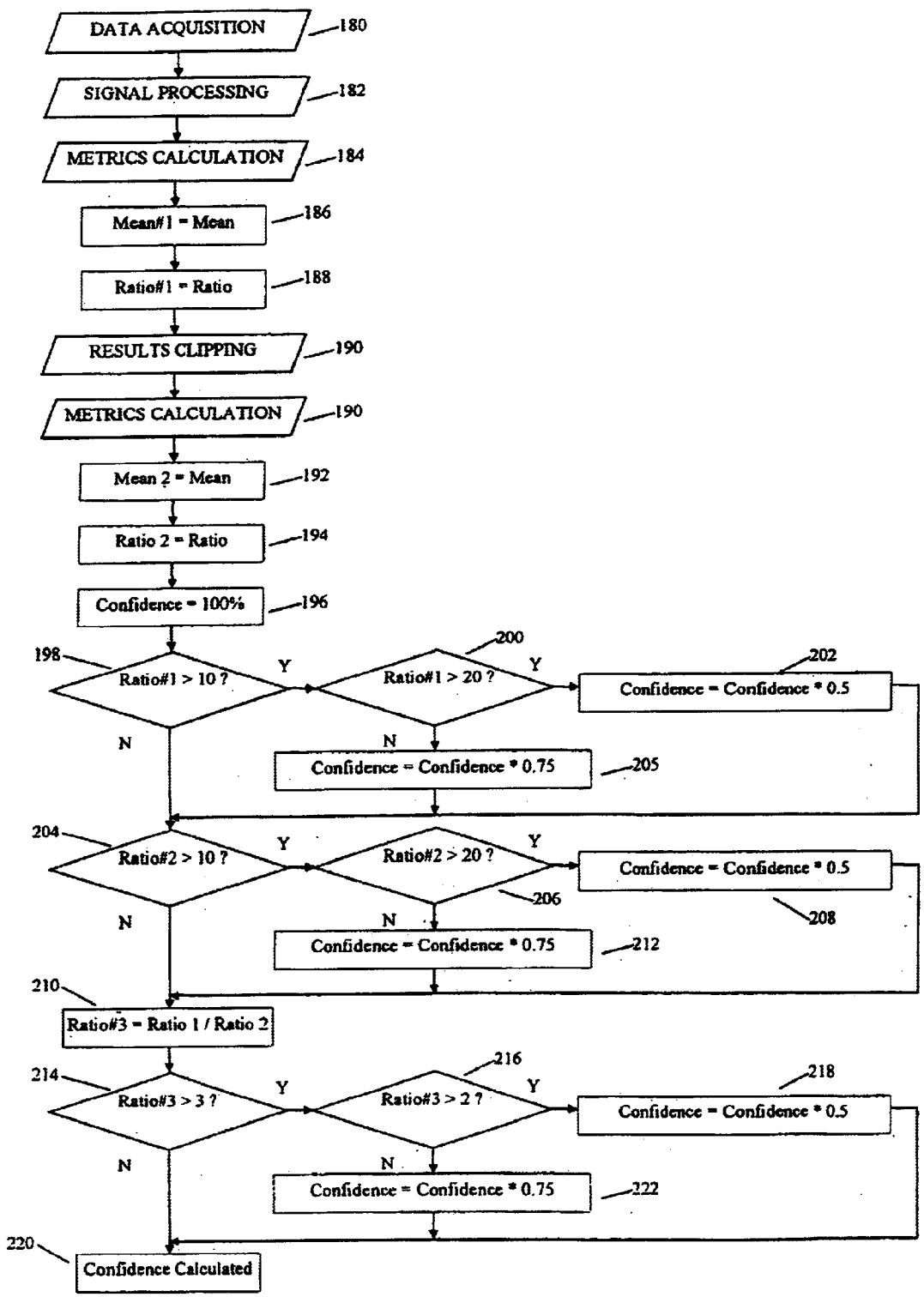
FIG. 13 illustrates steps in computing confidence results in a fault locating device of the invention.

FIG. 13 illustrates program steps in computing confidence results, including the steps described in the flow charts of FIGS. 9, 10, 11 and 12.

Firstly, at steps 180, 182 and 184, the steps illustrated respectively by the flow charts of FIGS. 9, 10 and 11 are effected. At steps 186, 188 mean #1 and ratio #1 values are set to the mean and ratio value respectively, as computed previously, and results clipping then occurs at step 190, in accordance with the flow diagram of FIG. 12. Subsequently, at steps 192, 194 mean #2 and ratio #2 are set to the resultant values of mean and ratio determined at step 190. Then, at step 196, a confidence value is set to 100% and, subsequently, at step 198, a determination is made as to whether the value of ratio #1 is greater than 10. If it is greater, at step 200 it is determined whether ratio #1 exceeds 20. If so, the confidence value is set to confidence *0.5 at step 202, after which processing proceeds to step 204 later described. In the event that the result of the comparison of step 198 should be that the ratio #1 is not greater than 10, program execution likewise proceeds at once to step 204. If, at step 200, the ratio #1 is determined as not being greater than 20, then at step 205, the confidence value is set to confidence *0.75, after which program execution again continues at step 204. At steps 204, 206, 208, 212 program steps corresponding to steps 198, 200, 202 and 205 respectively are performed with respect to ratio #2 after which program execution continues at step 210. At step 210, a ratio #3 is computed by dividing the ratio #1 by the ratio #2 value after which program execution continues at step 214. At steps 214, 216, 218 and 222, program steps again corresponding to steps 198, 200, 202, 205 are performed with respect to the ratio #3, after which program execution terminates at step 220, at which confidence calculation is effected.

FIGS. 14 to 16 show the physical configuration of the fault location device 32. this has a casing 240 with an upper handle 242. Electrical components 246 are housed within the casing. The probes 24a, 24b project in spaced relationship from a framework 248 forming part of casing 240. Controls 250 for operating the device 32 are positioned at an upper part of the housing 240.

The described arrangement has been advanced merely by way of explanation and many modifications may be made thereto without departing from the spirit and scope of the invention which includes every novel feature and combination of novel features herein disclosed.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The reference to any prior art in this specification is not, and should not be taken as, an acknowledgment or any form of suggestion that that prior art forms part of the common general knowledge in Australia.

What is claimed is:

1. A device for determining location of a fault in an underground cable causing an earth leakage path from an internal conductor to earth at the location of the fault whereby, when signal is applied to the conductor, earth leakage signal flows between the earth and conductor at the location of the fault, wherein the applied signal is a multi-frequency signal having at least two frequency components, the device comprising:

probe means positionable to receive the earth leakage signal, and means for rectifying a first component of the earth leakage signal corresponding to a first frequency component of said applied signal, multiplying a rectified first component of the earth leakage signal with a second component of the earth leakage signal corresponding to a second frequency component of the applied signal and, from the result of said multiplication, determining a direction from the device to the fault.

2. A device as claimed in claim 1, wherein said multiplying is effected as an array multiplication of sets of time-spaced samples of the first and second components of the earth leakage signal.

3. A device as claimed in claim 1, further comprising means for detecting and removing signal artifacts due to switching transients or other external interference.

4. A device as claimed in claim 1, further comprising means for determining a confidence indication, indicating a degree of reliability of said result.

5. A device as claimed in claim 4, wherein said means for determining said confidence indication operates to determine said confidence indication by applying selected criteria to said result.

6. A device as claimed in claim 5, wherein said selected criteria includes the ratio between maximum positive or negative excursions of said result, and the means of said result.

7. A device as claimed in claim 5, wherein said selected criteria includes at least one of a signal-to-noise ratio of the result signal and said signal components.

8. The device as claimed in claim 5, wherein said selected criteria includes at least one of the absolute signal strength of the result signal, and said signal components.

9. A method for determining location of a fault in an underground cable, the method comprising:

applying a signal to the cable to cause generation of an earth leakage signal from an internal conductor of the cable to earth, at the location of the fault, the applied signal being a multi-frequency signal having at least two frequency components, receiving the earth leakage signal, rectifying a first component of the earth leakage signal corresponding to a first frequency component of said applied signal, multiplying a rectified first component of the earth leakage signal with a second component of the earth leakage signal corresponding to a second frequency component of the applied signal, and determining a direction from the device to the fault based on a result of said multiplying.

10. A method as claimed in claim 9, wherein said multiplying is effected as an array multiplication of sets of time-spaced samples of the first and second components of the earth leakage signal.

* * * * *